United States Patent
Chen et al.

(10) Patent No.: US 10,388,714 B2
(45) Date of Patent: Aug. 20, 2019

(54) ORGANIC LIGHT EMITTING DISPLAY PANEL AND DISPLAY TERMINAL

(71) Applicant: Shanghai Tianma AM-OLED Co., Ltd., Shanghai (CN)

(72) Inventors: Xian Chen, Shanghai (CN); Lijing Han, Shanghai (CN); Lu Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 97 days.

(21) Appl. No.: 15/796,686

(22) Filed: Oct. 27, 2017

(65) Prior Publication Data

US 2018/0342569 A1    Nov. 29, 2018

(30) Foreign Application Priority Data

May 27, 2017 (CN) .......................... 2017 1 0395654

(51) Int. Cl.
*H01L 27/32* (2006.01)
*H01L 51/52* (2006.01)
(Continued)

(52) U.S. Cl.
CPC ........ *H01L 27/3276* (2013.01); *G06F 3/0412* (2013.01); *G09G 3/3225* (2013.01);
(Continued)

(58) Field of Classification Search
None
See application file for complete search history.

(56) References Cited

U.S. PATENT DOCUMENTS

| | | | |
|---|---|---|---|
| 9,450,034 B2 * | 9/2016 | Lee | H01L 27/3246 |
| 2006/0145606 A1 * | 7/2006 | Lee | H01L 27/3276 |
| | | | 313/509 |

(Continued)

FOREIGN PATENT DOCUMENTS

| CN | 1573846 A | 2/2005 |
|---|---|---|
| CN | 101777576 A | 7/2010 |

OTHER PUBLICATIONS

Chinese OA dated Jun. 17, 2017 for corresponding CN Application No. 201710395654.2.

*Primary Examiner* — Duane N Taylor, Jr.
(74) *Attorney, Agent, or Firm* — Tarolli, Sundheim, Covell & Tummino LLP

(57) ABSTRACT

Provided are an organic light-emitting display panel and a display terminal. The organic light-emitting display panel comprises: a substrate; pixel units located on the substrate, each pixel unit comprising a drain electrode, a pixel electrode and a light-emitting layer; power signal conduction lines located on the substrate, a conduction layer and a first insulation layer being located between the conduction layer and the pixel electrode; the conduction layer comprising a first conduction portion and second conduction portions insulated from the first conduction portion, wherein the second conduction portions are insulated from each other, the first conduction portion is electrically connected with the power signal conduction lines; and the second conduction portions are electrically connected with the drain electrodes in one-to-one correspondence; and an electrode through hole is defined in the first insulation layer, the pixel electrode extends through the electrode through hole to electrically connect with the second conduction portion.

20 Claims, 15 Drawing Sheets

(51) Int. Cl.
  *G06F 3/041*    (2006.01)
  *G09G 3/3225*   (2016.01)
(52) U.S. Cl.
  CPC ........ *H01L 27/323* (2013.01); *H01L 51/5203*
              (2013.01); *G09G 2310/0264* (2013.01)

(56) References Cited

U.S. PATENT DOCUMENTS

| | | | |
|---|---|---|---|
| 2008/0018245 A1* | 1/2008 | Kim | H01L 27/3253 |
| | | | 313/512 |
| 2015/0090988 A1* | 4/2015 | Oooka | H01L 51/5228 |
| | | | 257/40 |
| 2015/0179724 A1* | 6/2015 | Lee | H01L 27/3241 |
| | | | 257/40 |
| 2016/0064467 A1* | 3/2016 | Ota | H01L 27/3276 |
| | | | 257/40 |
| 2018/0233550 A1* | 8/2018 | Han | H01L 27/3276 |
| 2018/0261663 A1* | 9/2018 | Li | G09G 3/3225 |

* cited by examiner

ORGANIC LIGHT EMITTING DISPLAY PANEL AND DISPLAY TERMINAL

CROSS-REFERENCE TO RELATED APPLICATIONS

The present application claims priority to Chinese Patent Application No. 201710395654.2, filed on May 27, 2017, the content of which is incorporated herein by reference in its entirety.

TECHNICAL FIELD

The present disclosure relates to the field of display technologies and, particularly, relates to an organic light-emitting display panel and a display terminal.

BACKGROUND

With the rapid development of the display field, the organic light emitting diode (OLED) display terminal and the liquid crystal display terminal have become very popular in recent years. Accordingly, there are increasing demands on the performance of these display terminals.

A current wiring of a display panel of the prior art includes a power signal conduction line having one end connected with a current input end, and the other end successively extending to the respective pixel units of the display terminal, for providing a driving current to the respective pixel units.

Since the number of power signal conduction line is great and the power signal conduction line has a small cross-sectional area, therefore, the power signal conduction line itself has great resistance. As a result, the current on the power signal conduction line decreases from one end to the other end, thereby causing a problem of non-uniform brightness of the display terminal.

Further, since an anode through hole needs to be defined in the display panel, and the area where the anode through hole is located blocks a part of the display area of the display terminal, resulting in low opening rate of the display terminal.

SUMMARY

The present disclosure provides an organic light-emitting display panel and a display terminal, so as to provide a more uniform brightness of the display terminal.

In one aspect, the present disclosure provides an organic light-emitting display panel, including: a substrate; a plurality of pixel units placed on the substrate, each of the plurality of pixel units including a drain electrode, a pixel electrode and a light-emitting layer, the drain electrode, the pixel electrode and the light-emitting layer being placed on the substrate in sequence; a plurality of power signal conduction lines located on the substrate; a conduction layer including at least one first conduction portion and a plurality of second conduction portions, and a first insulation layer placed between the conduction layer and the pixel electrodes; wherein the at least one first conduction portion is insulated from the plurality of second conduction portions, the plurality of second conduction portions is insulated from each other, the at least one first conduction portion is electrically connected with the plurality of power signal conduction lines; and the plurality of second conduction portions is electrically connected with the drain electrodes in one-to-one correspondence; and wherein an electrode through hole is defined in the first insulation layer, the pixel electrode extends through the electrode through hole to be electrically connected with the second conduction portion.

In another aspect, the present disclosure provides a display terminal including the above-described organic light-emitting display panel.

The solutions provided by the present disclosure have at least the following beneficial effects:

In the present disclosure, a conduction layer is added in the organic light-emitting display panel, the conduction layer includes the first conduction portion and the second conduction portion, the first conduction portion is electrically connected with the power signal conduction line, and the pixel electrode is electrically connected with the second conduction portion. After the first conduction portion is electrically connected with the power signal conduction line, their total resistance is reduced, and attenuation of the cooperatively transmitted power signal is also reduced, that is, the power voltage along the extending direction of the power signal conduction line will not attenuate significantly. Therefore, a display terminal using such organic light-emitting display panel can have more uniform display brightness. Further, the second conduction portion is electrically connected with both the pixel electrode and the drain electrode, and location of the through hole through which the second conduction portion is directly connected with the pixel electrode can be flexibly arranged, which does not occupy the display area for the pixels and helps to increase the opening rate and improve display brightness.

It should be interpreted that the general description above and the detailed description below are merely exemplary, which cannot limit the present disclosure.

REFERENCE SIGNS

1—power signal conduction line;
2—display area;
10—integrated circuit;
11—substrate;
12—pixel unit;
120—source electrode;
121—drain electrode;
122—gate electrode;
123—pixel electrode;
124—light-emitting layer;
13—power signal conduction line;
14—conduction layer;
140—first conduction portion;
140a—hollow portion;
141—second conduction portion;
15—first insulation layer;
150—electrode through hole;
16—second insulation layer;
160—first conduction-layer through hole;
161—second conduction-layer through hole;
170—data-signal conduction line;
171—power signal line;
172—data signal line;
173—cathode layer;
174—cathode signal conduction line;
175—touch electrode;
176—touch signal line;
20—organic light-emitting display panel.

The accompanying drawings herein are incorporated into the specification and constitutes a part of the specification, showing embodiments in accordance with the present disclosure, and illustrating the principles of the present disclosure together with the specification.

DESCRIPTION OF EMBODIMENTS

In order to better understand the technical solutions of the present disclosure, embodiments of the present disclosure are described in detail as follows with reference to the accompanying drawings.

It should be noted that, the described embodiments are merely a part of the embodiment of the present disclosure but not all of the embodiments. Based on the embodiments in the present disclosure, all other embodiments obtained by those skilled in the art without any creative efforts shall fall into the protection scope of the present disclosure.

The terms used in the embodiments are merely intended to illustrate the specific embodiment, but not to limit the present disclosure. An expression of "a", "an", "the" or "such" in a singular form used in the embodiments and claims of the present disclosure is also intended to include the plural form thereof, unless otherwise noted.

Figure 1:
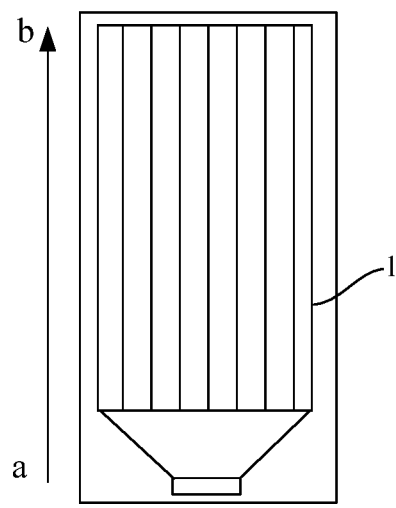
FIG. 1 illustrates a schematic diagram of a current wiring of a display panel.

A current wiring of a display panel of the prior art is shown in FIG. 1. As shown in FIG. 1, a power signal conduction line 1 has one end connected with a current input end, and the other end successively extending to the respective pixel units of the display terminal, for providing a driving current to the respective pixel units. For example, the current input end of the display terminal is defined as end a, the other end is defined as end b, and the power signal conduction line 1 extends from end a to end b.

Since the number of power signal conduction line 1 is great and the power signal conduction line has a small cross-sectional area, therefore, the power signal conduction line itself has great resistance. As a result, the current on the power signal conduction line 1 decreases from end a to end b, so that the brightness of end b is significantly lower than the brightness of end a, thereby causing a problem of non-uniform brightness of the display terminal.

Figure 2:
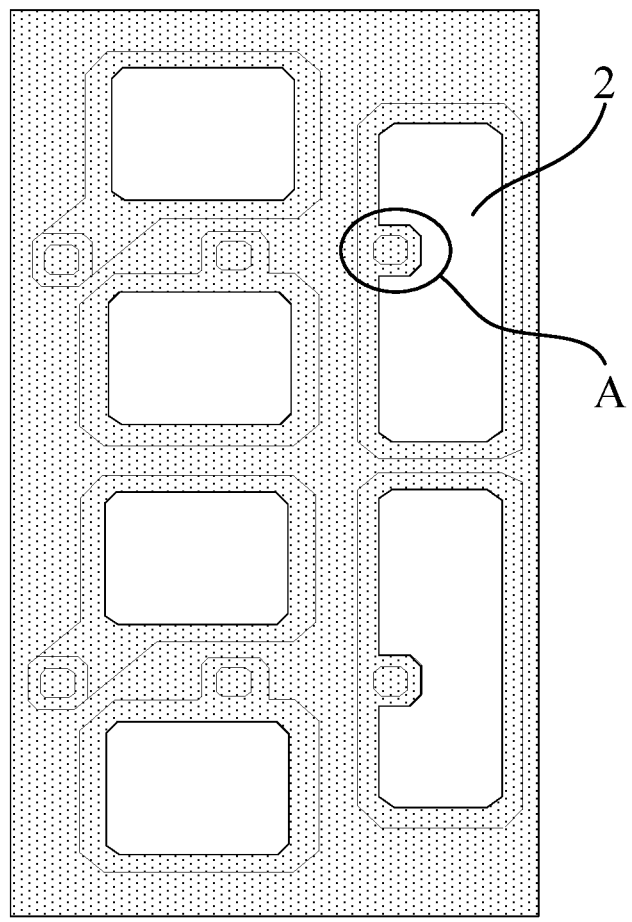
FIG. 2 illustrates a structural schematic diagram of a display panel.
Figure 3:
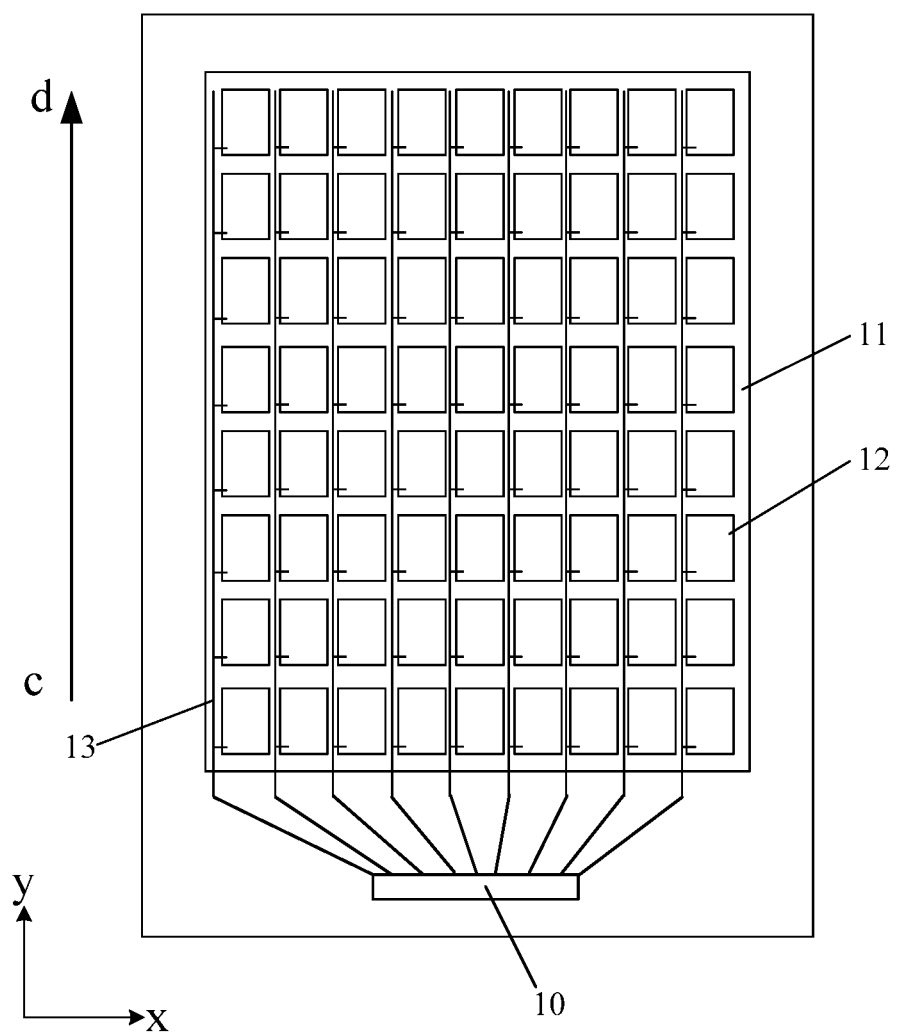
FIG. 3 illustrates a top view of an organic light-emitting display panel according to an embodiment of the present disclosure.
Figure 4:
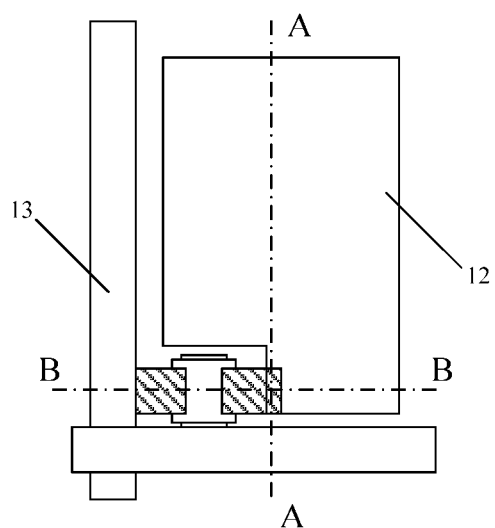
FIG. 4 illustrates a structural schematic diagram of a pixel unit of an organic light-emitting display panel according to an embodiment of the present disclosure.
Figure 5:
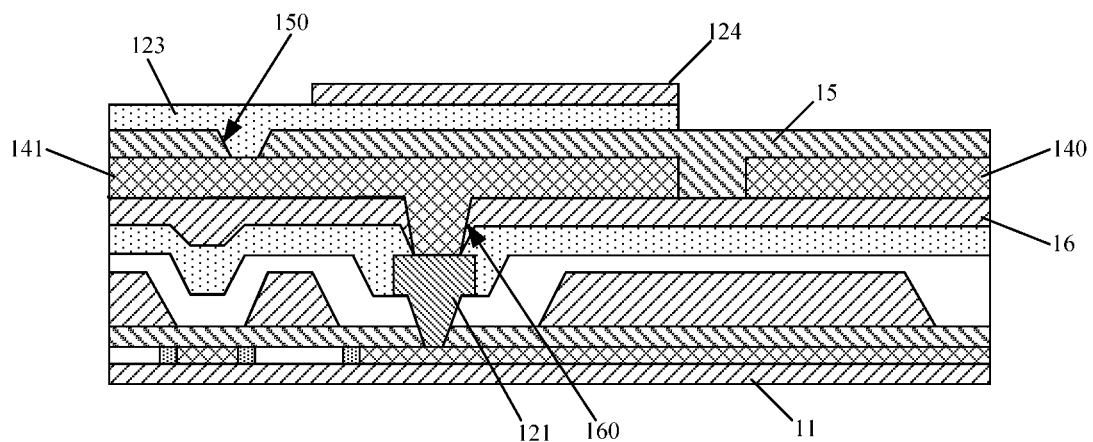
FIG. 5 illustrates a cross-sectional view along direction A-A in FIG. 4.
Figure 6:
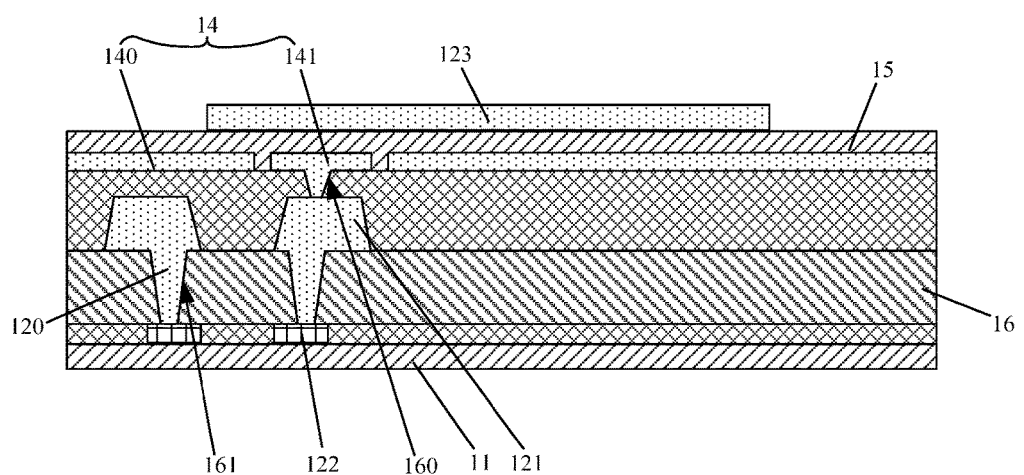
FIG. 6 illustrates a cross-sectional view along direction B-B in FIG. 4.
Figure 7:
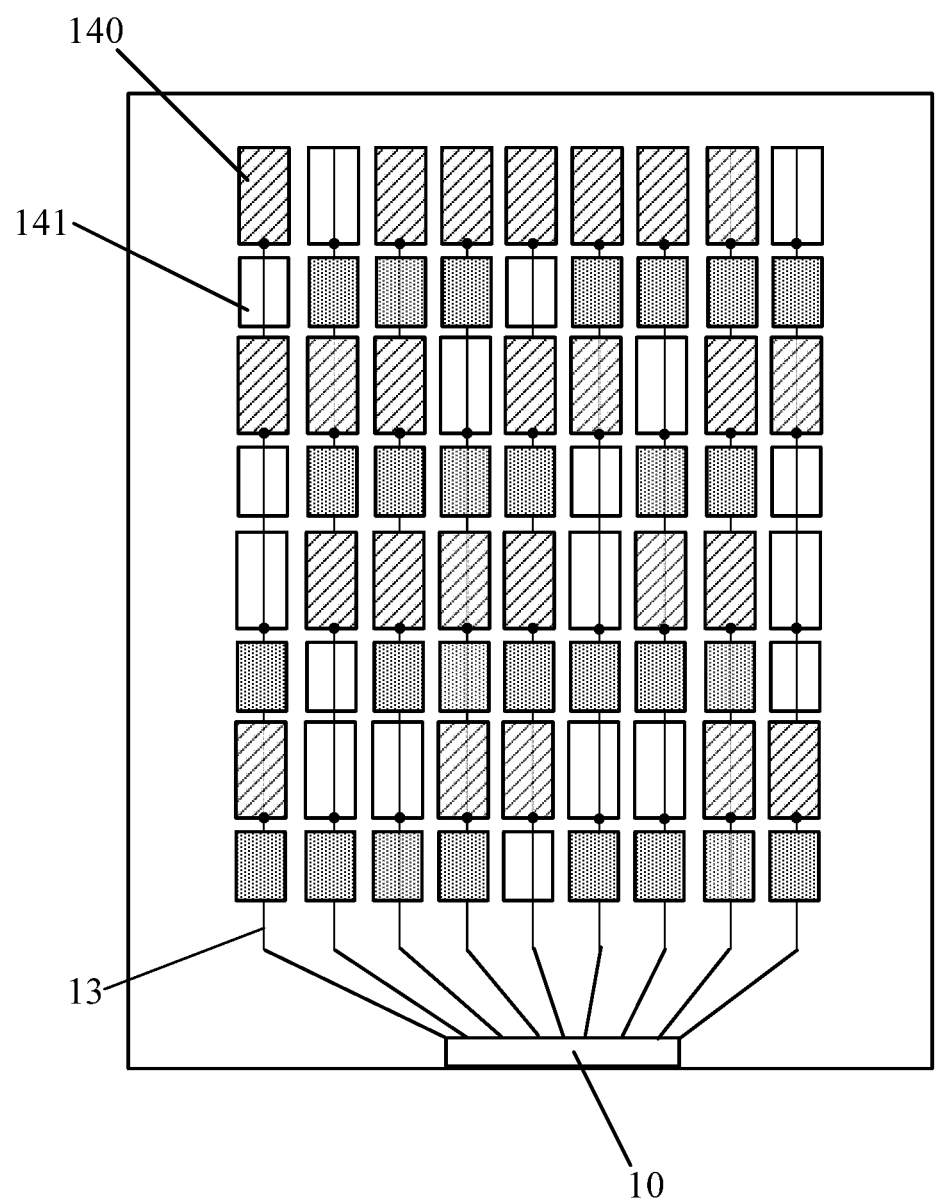
FIG. 7 illustrates a partial schematic diagram of an organic light-emitting display panel according to an embodiment of the present disclosure.
Figure 8:
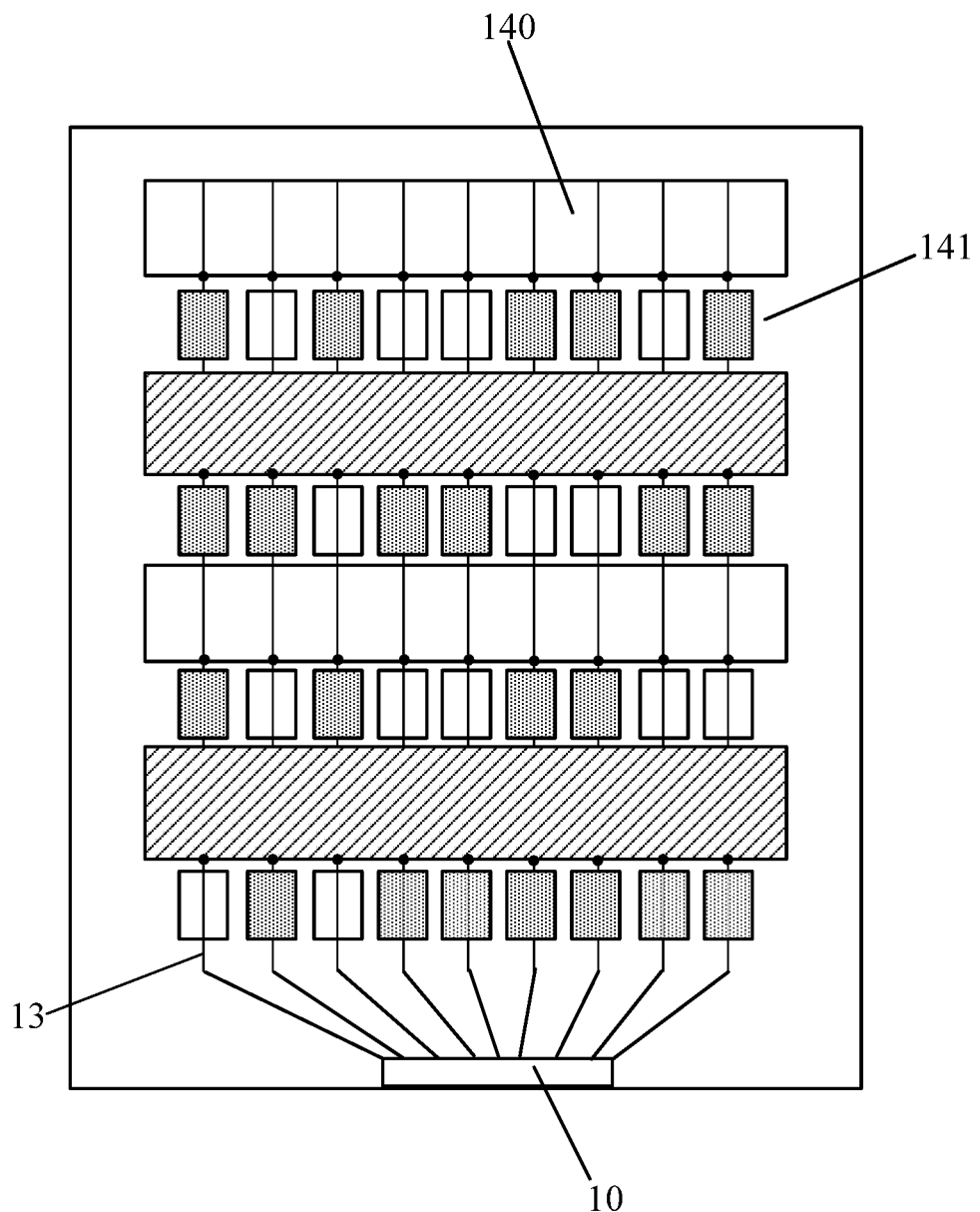
FIG. 8 illustrates a partial schematic diagram of another organic light-emitting display panel according to an embodiment of the present disclosure.

Further, as shown in FIG. 2, since an anode through hole needs to be defined in the display panel, and area A, where the anode through hole is located, blocks a part of the display area 2 of the display terminal, resulting in low opening rate of the display terminal FIG. 3 illustrates a top view of an organic light-emitting display panel according to an embodiment of the present disclosure. As shown FIG. 3, the organic light-emitting display panel includes :

a substrate 11;

a plurality of pixel units 12 located on the substrate 11, wherein the plurality of pixel units 12 is distributed in an array, the row direction of the array is the x direction shown in FIG. 3, and the column direction thereof is the y direction shown in FIG. 3; FIG. 4 illustrates a structural schematic diagram of a pixel unit, FIG. 5 illustrates a cross-sectional view along direction A-A in FIG. 4, and FIG. 6 illustrates a cross-sectional view along direction B-B in FIG. 4, as shown in FIGS. 4-6, each pixel unit 12 includes, on the substrate 11, a source electrode 120, a drain electrode 121, a gate electrode 122, a pixel electrode 123 and a light-emitting layer 124; the pixel electrode 123 is placed on the drain electrode 121, the light-emitting layer 124 is placed on the pixel electrode 123, and the light-emitting layer 124 may be made of an organic material;

a plurality of power signal conduction lines 13 located on the substrate 11, each power signal conduction line 13 is electrically connected with an integrated circuit 10, thereby providing a driving current for the entire organic light-emitting display panel;

a conduction layer 14, the conduction layer 14 including at least one first conduction portion 140 and a plurality of second conduction portions 141, wherein the at least one first conduction portion 140 is insulated from the plurality of second conduction portions 141, the plurality of second conduction portions 141 is insulated from each other; the at least one first conduction portion 140 is electrically connected with the plurality of power signal conduction lines 13, and is connected with the source electrode 120; each of the plurality of second conduction portions 141 is electrically connected with one drain electrode 121 in one-to-one correspondence; the shape of the first conduction portion 140 and the second conduction portion 141 can be flexibly selected; FIG. 7 illustrates a partial schematic diagram of an organic light-emitting display panel according to an embodiment of the present disclosure, as shown in FIG. 7, either of the first conduction portion 140 and the second conduction portion 141 is a block-like structure, every two first conduction portions 140 are spaced from each other, every two second conduction portions 141 are spaced from each other, and each first conduction portion 140 and its adjacent second conduction portion 141 are spaced from each other, thereby realizing the above-mentioned insulation; FIG. 8 illustrates a partial schematic diagram of another organic light-emitting display panel according to an embodiment of the present disclosure, as shown in FIG. 8, either of the first conduction portion 140 and the second conduction portion 141 can be a strip-like structure, every two first conduction portions 140 are spaced from each other, every two second conduction portions 141 are spaced from each other, and each first conduction portion 140 and its adjacent second conduction portion 141 are spaced from each other, thereby realizing the above-mentioned insulation;

a first insulation layer 15 located between the conduction layer 14 and the pixel electrode 123, wherein an electrode through hole 150 is defined in the first insulation layer 15, the pixel electrode 123 extends through the electrode through hole 150 to be electrically connected with the second conduction portion 141; the first insulation layer 15 can be made of material with a small dielectric constant, for example, silicon nitride or silicon oxide.

When the organic light-emitting display panel in the present embodiment is working, the integrated circuit 10 outputs a current to the power signal conduction line 13, and further to the source electrode 120 by the first conduction portion 140 electrically connected with the power signal conduction line 13. When the gate electrode 122 of the pixel unit 12 is electrified, the source electrode 120 is conducted with the drain electrode 121 by a semiconductor layer, the power signal is conducted to the pixel electrode 123 via the second conduction portion 141 to lighten the pixel electrode 123, so as to facilitate working of the organic light-emitting display panel.

In the organic light-emitting display panel of the present embodiment, after the first conduction portion 140 is electrically connected with the power signal conduction line 13, the total resistance becomes smaller, and attenuation of the cooperatively conducted power signal becomes less, that is, the power voltage in an extending direction of the power signal conduction line 13 (i.e., the direction from c to d in FIG. 3) will not attenuate significantly. Therefore, a display terminal using such an organic light-emitting display panel can have more uniform display brightness.

In an alternative embodiment, the first conduction portion 140 covers the power signal conduction line 13 along an extending direction of the power signal conduction line 13. The extending direction of the power signal conduction line 13 is the direction from c to d shown in FIG. 3, and at least one part of one power signal conduction line 13 can be parallel to at least one part of any other power signal conduction line 13. By such solution, an orthographic projection of the first conduction portion 140 on the substrate 11 will covers an orthographic projection of the power signal conduction line 13 on the substrate 11, and the connection therebetween can extend from one end of the power signal conduction line 13 to the other end of the power signal conduction line 13. Optionally, the contact area between the first conduction portion 140 and the power signal conduction line 13 can be increased, and meantime the size of the first conduction portion 140 can also be increased, so that the first conduction portion 140 can have smaller resistance difference for all positions thereon, and the power signal conduction line 13 can more efficiently conduct the current to the first conduction portion 140, thereby enabling more uniform brightness of the organic light-emitting display panel.

Based on the above invention concept, when the first conduction portion 140 can cover all the pixel units, the first conduction portion 140 should have a larger size, and the contact area with power signal conduction line 13 would also increase accordingly. For example, in one alternative embodiment, there is only one first conduction portion 140, the orthographic projection of the first conduction portion 140 on the substrate 11 covers orthographic projections of all the pixel units 12 on the substrate 11, that is, the first conduction portion 140 is spread out with an undivided surface. Thus, the first conduction portion 140 can function better, thereby enabling better brightness uniformity of the organic light-emitting display panel.

Figure 9:
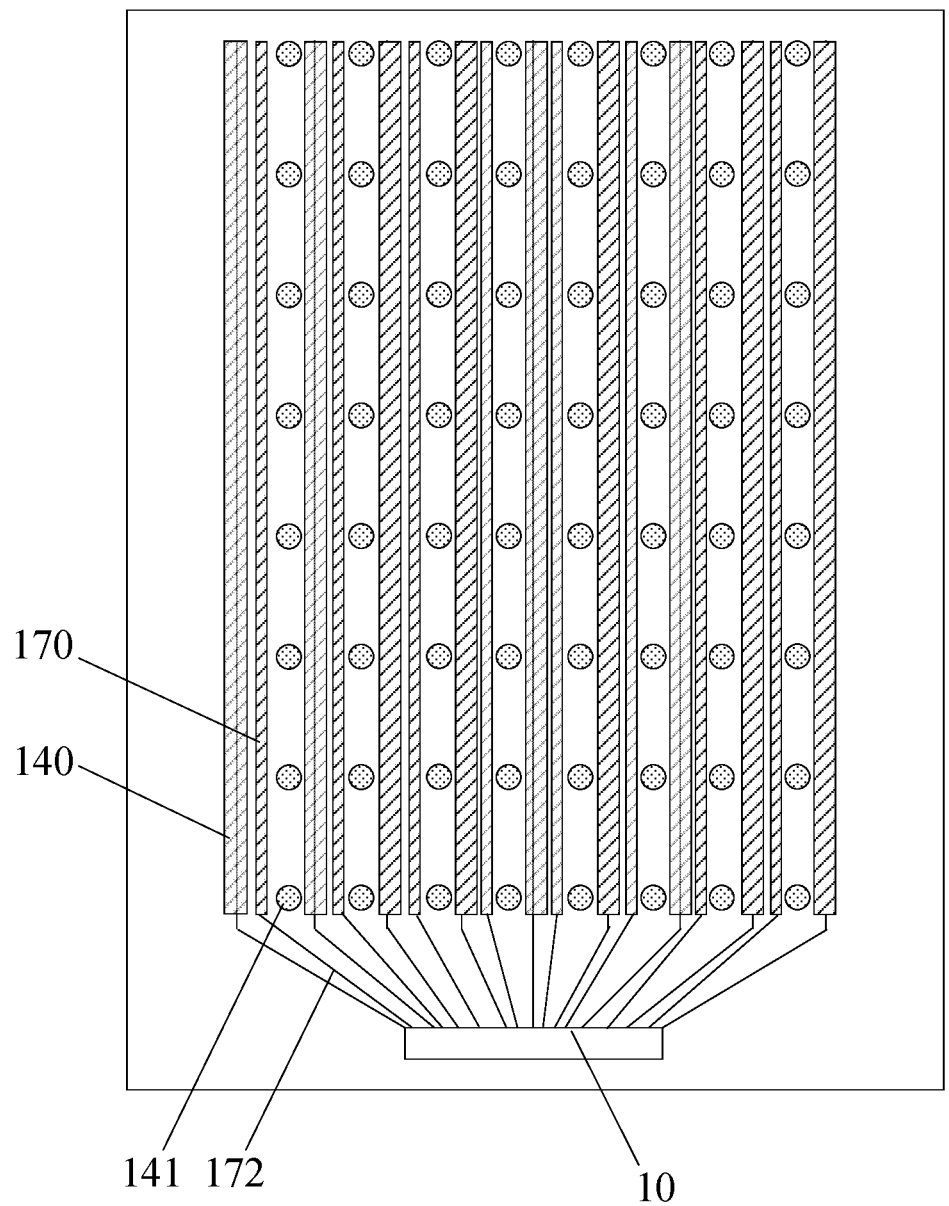
FIG. 9 illustrates a partial schematic diagram of still another organic light-emitting display panel according to an embodiment of the present disclosure.

As for the configuration of the first conduction portion 140 and the second conduction portion 141, the block-like structure in FIG. 7 and the strip-like structure in FIG. 8 are already described as above. FIG. 9 illustrates a partial schematic diagram of still another organic light-emitting display panel according to an embodiment of the present disclosure, as shown in FIG. 9, when the first conduction portion 140 is a strip-like structure, considering that the organic light-emitting display panel generally further includes a plurality of data-signal conduction lines 170, a gap is thus defined between every two adjacent first conduction portions 140, a part of the plurality of data-signal conduction lines 170 is located in a same metal layer where the first conduction portion 140 is located, and is located in the above-mentioned gap. Accordingly, a part of the plurality of data-signal conduction lines 170 can be arranged in the metal layer where the first conduction portion 140 is located, thereby reducing space to be occupied by the data-signal conduction line 170 at other positons, and bringing convenience for arranging the components of the organic light-emitting display panel.

Figure 10:
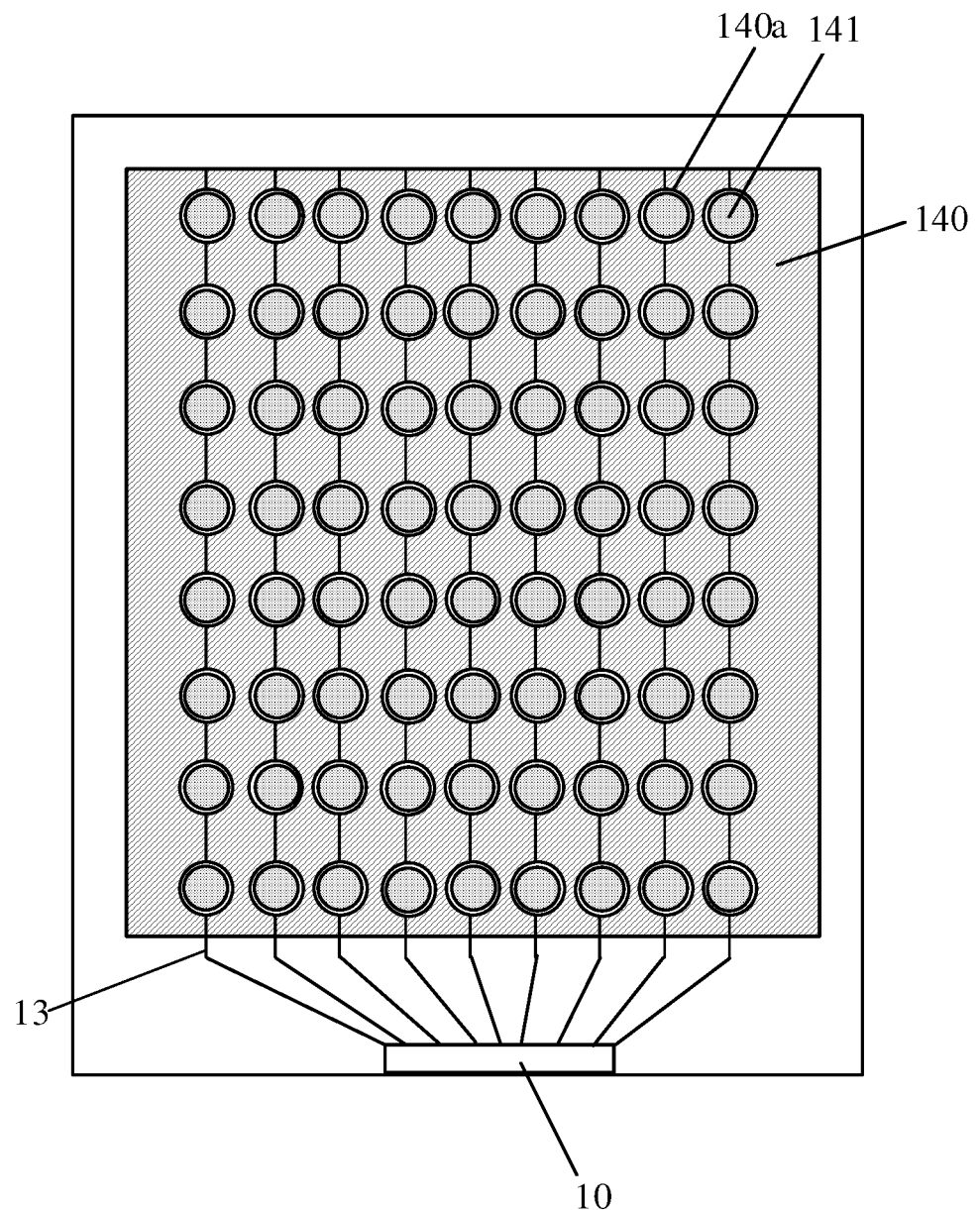
FIG. 10 illustrates a partial schematic diagram of still another organic light-emitting display panel according to an embodiment of the present disclosure.

By adopting the above configuration, each first conduction portion 140 can have a smaller size. The larger the size of the first conduction portion 140, the better the brightness uniformity of the organic light-emitting display panel. Optionally, FIG. 10 illustrates a partial schematic diagram of an organic light-emitting display panel according to still another embodiment of the present disclosure. As shown in FIG. 10, the first conduction portion 140 is a continuous conductive block, a plurality of hollow portions 140a are defined in the first conduction portion 140, and the second conduction portion 141 is located in the hollow portion 140a. During manufacturing the organic light-emitting display panel, in order to separate the first conduction portion 140 from the second conduction portion 141, partial material can be etched off from an integral material, thereby forming the hollow portion 140a in the first conduction portion 140. By the hollow portion 140a, the area occupied by the second conduction portion 141 can be smaller, and the size of the first conduction portion 140 can be larger accordingly, thereby enabling more uniform display brightness of the organic light-emitting display panel.

The shape of the hollow portion 140a can be circular, square, elliptical, etc. In order to simplify the manufacturing process, the hollow portion 140a can be shaped in a circle as shown in FIG. 10, and correspondingly, the second conduction portion 141 in the hollow portion 140a can also be circular, thereby allowing more uniform gap therebetween. The gap between the first conduction portion 140 and the second conduction portion 141 can be filled with an insulation material, so as to achieve insulation therebetween. Optionally, the insulation material herein can be a part of the first insulation layer 15.

Figure 11:
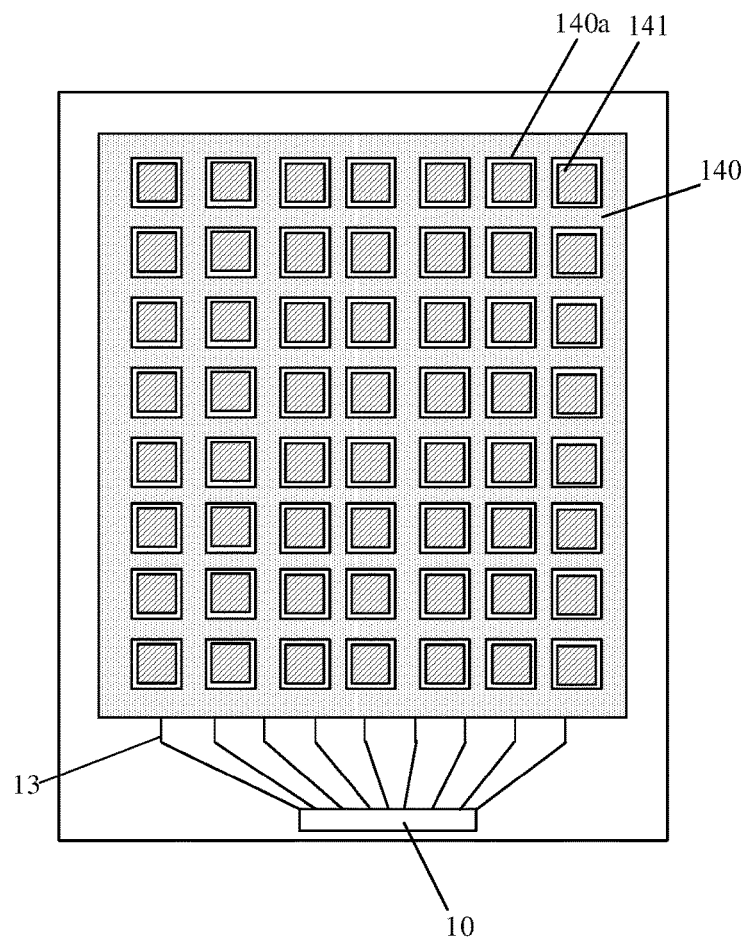
FIG. 11 illustrates a partial schematic diagram of still another organic light-emitting display panel according to an embodiment of the present disclosure.

FIG. 11 illustrates a partial schematic diagram of still another organic light-emitting display panel according to an embodiment of the present disclosure. As shown in FIG. 11, the conduction layer includes only one first conduction portion 140, and the first conduction portion 140 is a grid-like structure.

The entire conduction layer 14 can be arranged between the substrate 11 and the power signal conduction line 13, however, the power signal conduction line 13 is generally close to the substrate 11, and most components of the organic light-emitting display panel are arranged at a side of the power signal conduction line 13 away from substrate 11, in view of this, if the entire conduction layer 14 is placed between the substrate 11 and the power signal conduction line 13, the connection between the conduction layer 14 and other components including the pixel electrode 123 will be more complicated. In order to simplify the structure of the organic light-emitting display panel, the conduction layer 14 can be arranged at a side of the power signal conduction line 13 away from the substrate 11, thereby providing sufficient space for arranging the conduction layer 14 and other correlated structures.

In an alternative embodiment, the organic light-emitting display panel can further include a second insulation layer 16 located between the drain electrode 121 and the conduction layer 14, a first conduction-layer through hole 160 is defined in the second insulation layer 16, and the second conduction portion 141 extends through the first conduction-layer through hole 160 to be connected with the drain electrode 121. The second insulation layer 16 can be made of a material with a small dielectric constant, for example, silicon nitride or silicon oxide.

Figure 12:
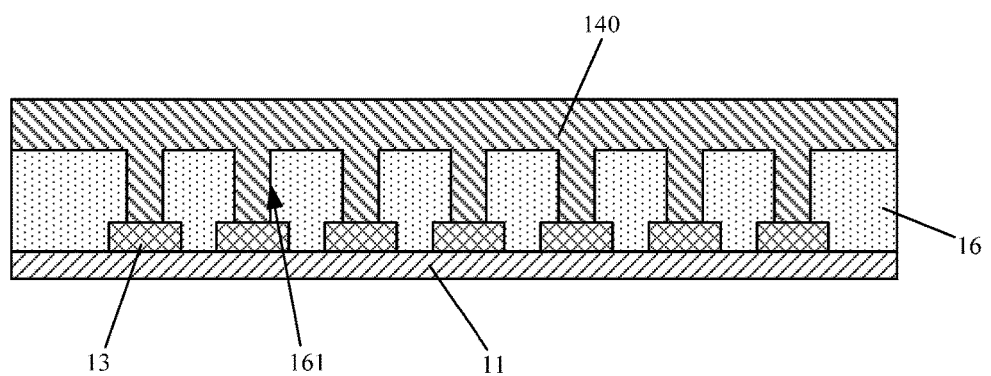
FIG. 12 illustrates a schematic diagram of a connection between a first conduction portion and a power signal conduction line in an organic light-emitting display panel according to an embodiment of the present disclosure.

To arrange the second insulation layer 16, the power signal conduction line 13 and the drain electrode 121 can be arranged in one layer, thereby enhancing structural compactness of the organic light-emitting display panel. FIG. 12 illustrates a schematic diagram of connection between a first conduction portion and a power signal conduction line in an organic light-emitting display panel according to an embodiment of the present disclosure. As shown in FIG. 12, a second conduction-layer through hole 161 is defined in the second insulation layer 16, and the first conduction portion 140 extends through the second conduction-layer through hole 161 to be connected with the power signal conduction line 13.

As mentioned above, an electrode through hole 150 is defined in the first insulation layer 15, and the pixel electrode 123 extends through the electrode through hole 150 to be connected with the second conduction portion 141. It can be understood that, in an thickness direction of organic light-emitting display panel, the electrode through hole 150 can be arranged facing the first conduction-layer through hole 160, however, once such configuration is used, the problem of low opening rate of the display panel mentioned in the background will appear.

In order to solve the problem of low opening rate, the electrode through hole 150 is preferably misaligned with respect to the first conduction-layer through hole 160. As shown in FIG. 5, in the thickness direction of the organic light-emitting display panel, the electrode through hole 150 and the first conduction-layer through hole 160 are not symmetrically arranged, but are misaligned with respect to each other. By using such configuration, the positon where the electrode through hole 150 is located can be flexibly adjusted according to actual situation, thereby reducing adverse influence of the electrode through hole 150 on the opening rate of the organic light-emitting display panel.

The adverse influence of the electrode through hole 150 on the opening rate of the organic light-emitting display panel is mainly related to the location of the electrode through hole 150 with respect to the light-emitting layer 124 of the pixel unit 12. If the electrode through hole 150 is located in the light path of the light-emitting layer 124, then a part of the light emitted by the light-emitting layer 124 would definitely be blocked. In view of this, in order to completely eliminate the influence of the electrode through hole 150 on the opening rate, the orthographic projection of the electrode through hole 150 on the substrate 11 can be located outside the orthographic projection of the light-emitting layer 124 on the substrate 11. That is, the orthographic projection of the electrode through hole 150 on the substrate 11 does not overlap with the orthographic projection of the light-emitting layer 124 on substrate 11 at all, so that the light emitted by the light-emitting layer 124 will not be readily blocked, thereby improving the opening rate.

The location relation between the orthographic projection of the electrode through hole 150 on the substrate 11 and the orthographic projection of the light-emitting layer 124 on the substrate 11 has been described in the above embodiment. The relation between the orthographic projection of the first conduction-layer through hole 160 on the substrate 11 and the orthographic projection of the light-emitting layer 124 on substrate 11 will be described as follows. For example, the orthographic projection of the first conduction-layer through hole 160 on substrate 11 is located within the orthographic projection of the light-emitting layer 124 on the substrate 11, and the various first conduction-layer through holes 160 are distributed in an array.

By using the above configuration, on one hand, it helps to control the connection path between the drain electrode 121 and the second conduction portion 141, thereby reducing the internal resistance of the organic light-emitting display panel and improving current conduction efficiency; on the other hand, once the various first conduction-layer through holes 160 are arranged in a regular way, all the components in the organic light-emitting display panel will be orderly arranged, thereby contributing to the performance of the organic light-emitting display panel. Moreover, the manufacturing procedure of the first conduction-layer through hole 160 can also be simplified, thereby reducing the manufacturing cost of the organic light-emitting display panel.

Figure 13:
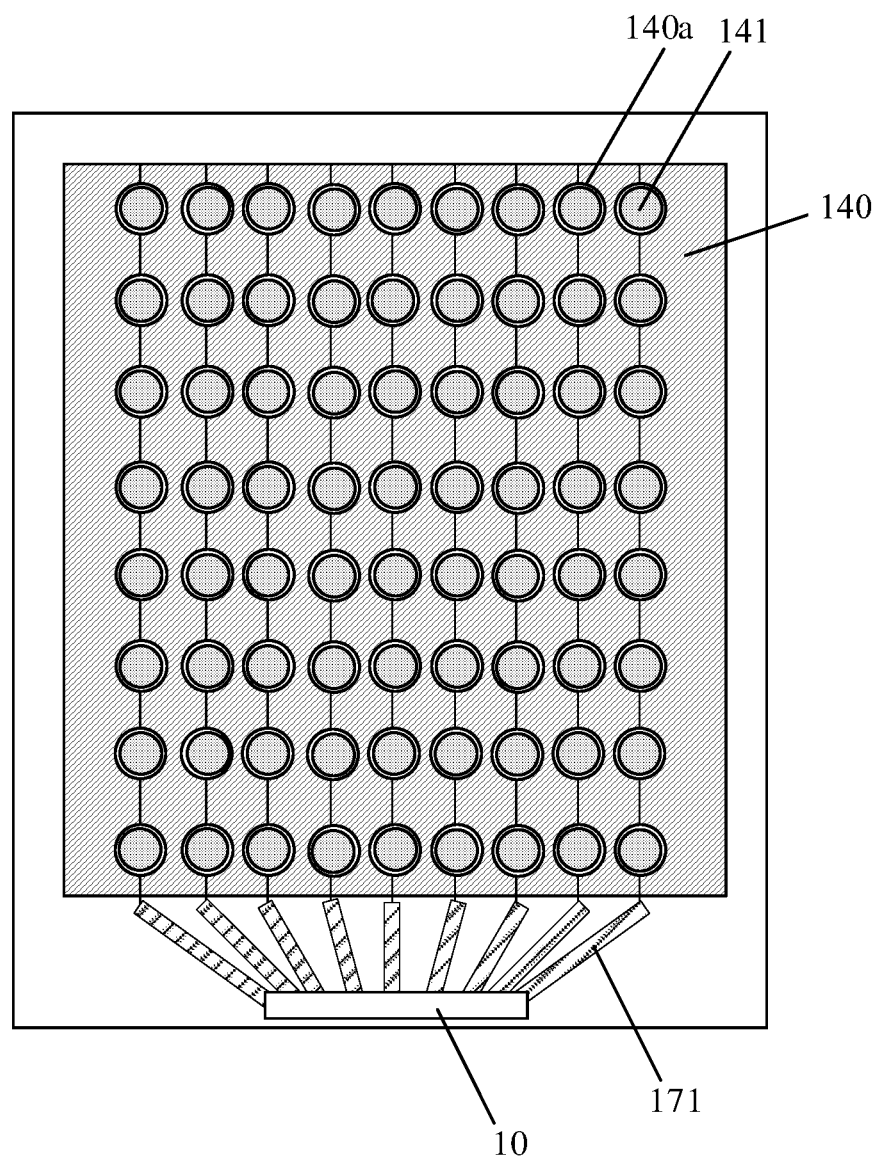
FIG. 13 illustrates a partial schematic diagram of still another organic light-emitting display panel according to an embodiment of the present disclosure.

According to an embodiment, in the organic light-emitting display panel, the substrate 11 can include a display area and a non-display area. FIG. 13 illustrates a partial schematic diagram of still another organic light-emitting display panel according to the present embodiment. As shown in FIG. 13, the non-display area can include the integrated circuit 10 as described above and a power signal line 171, both the power signal conduction line 13 and the first conduction portion 140 are electrically connected with the integrated circuit 10 by the power signal line 171, and the power signal line 171 and the first conduction portion 140 are located in a same metal layer. After the power signal line 171 is electrically connected with the first conduction portion 140, their total resistance will be further reduced, and the attenuation of the cooperatively transmitted power signal will be reduced, that is, the power voltage along the extending direction of the power signal line 171 will not attenuate significantly. Therefore, the organic light-emitting display panel can have better brightness uniformity.

Figure 14:
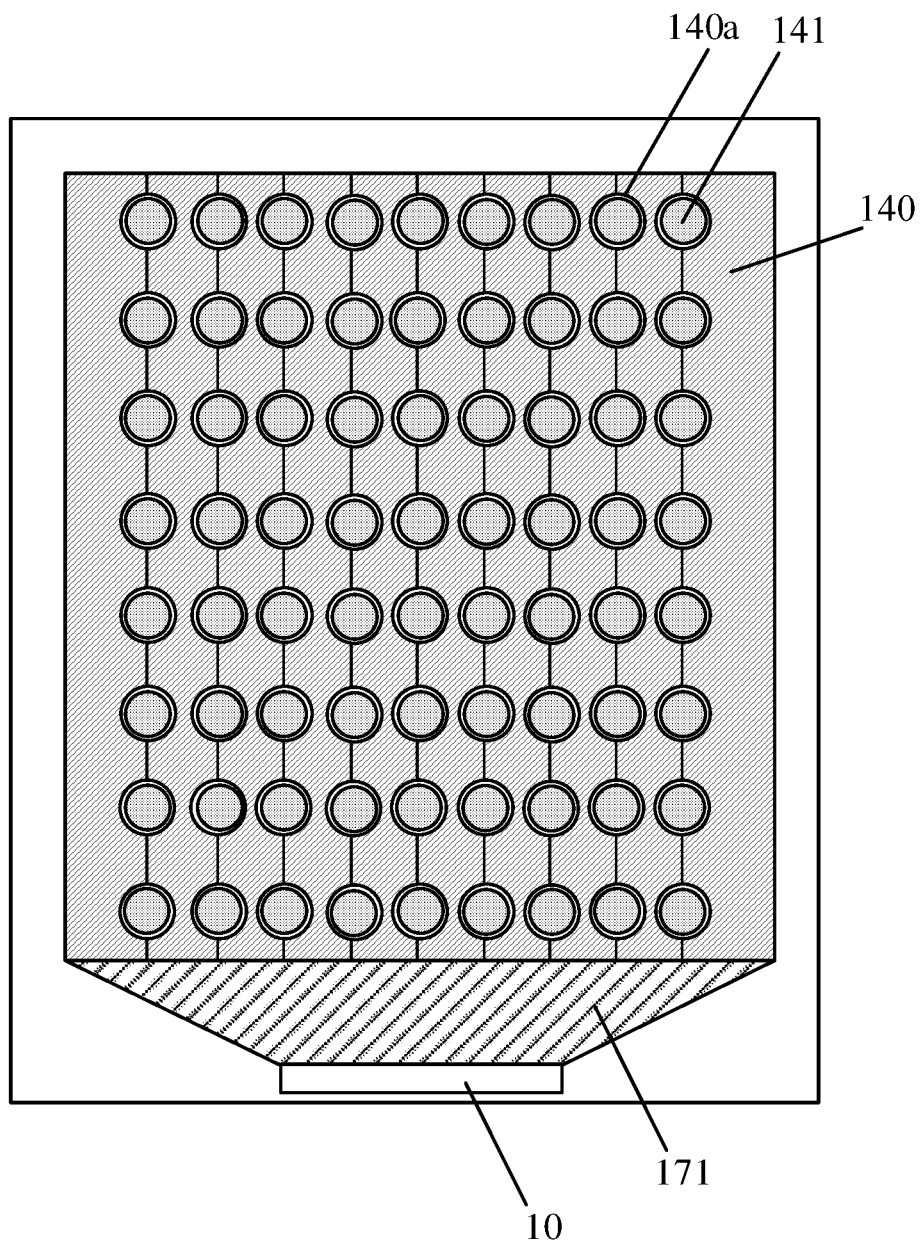
FIG. 14 illustrates a partial schematic diagram of still another organic light-emitting display panel according to an embodiment of the present disclosure.

As shown in FIG. 13, the described power signal line 171 can be a strip-like structure, however, the power signal line 171 with such configuration will have a great resistance. According to another embodiment of the organic light-emitting display panel as shown in FIG. 14, the power signal line 171 can be a metal block, and the metal block is connected with all the power signal conduction lines 13. At this time, the electric signal in the integrated circuit 10 is conducted by the metal block with small resistance, so that the attenuation of the power voltage of organic light-emitting display panel will become less, and the entire organic light-emitting display panel can have more uniform display brightness.

It can be understood that, as shown in FIG. 9, the organic light-emitting display panel includes a plurality of data-signal conduction line 170 and a plurality of data signal lines 172, all the data-signal conduction lines 170 are located in the display area, each data-signal conduction line 170 is electrically connected with drain electrodes 121 of multiple pixel units 12, the data-signal conduction line 170 is electrically connected with the integrated circuit 10 by the data signal line 172 located in the non-display area, and the data signal line 172 is located in the same metal layer as the first conduction portion 140. After the data signal line 172 is electrically connected with the first conduction portion 140, their total resistance will decrease, so that the organic light-emitting display panel can have more uniform display brightness.

Figure 15:
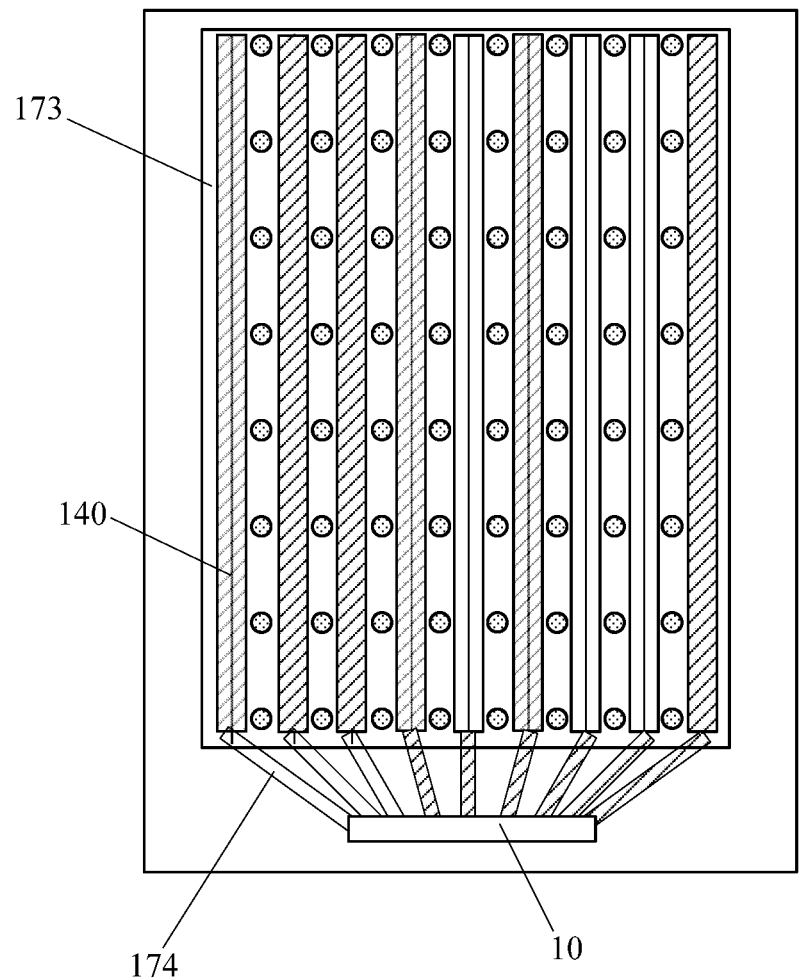
FIG. 15 illustrates a partial schematic diagram of still another organic light-emitting display panel according to an embodiment of the present disclosure.

FIG. 15 illustrates a partial schematic diagram of still another organic light-emitting display panel according to an embodiment of the present disclosure. As shown in FIG. 15, the organic light-emitting display panel further includes a cathode layer 173 and a cathode signal conduction line 174. The cathode signal conduction line 174 is electrically connected with both the cathode layer 173 and the integrated circuit 10, and the cathode signal conduction line 174 is located in the same metal layer as the first conduction portion 140. After the cathode signal conduction line 174 is electrically connected with the first conduction portion 140, their total resistance will further decrease, and attenuation of the cooperatively transmitted power signal will be reduced, thereby allowing better uniformity of the display brightness of the organic light-emitting display panel.

Figure 16:
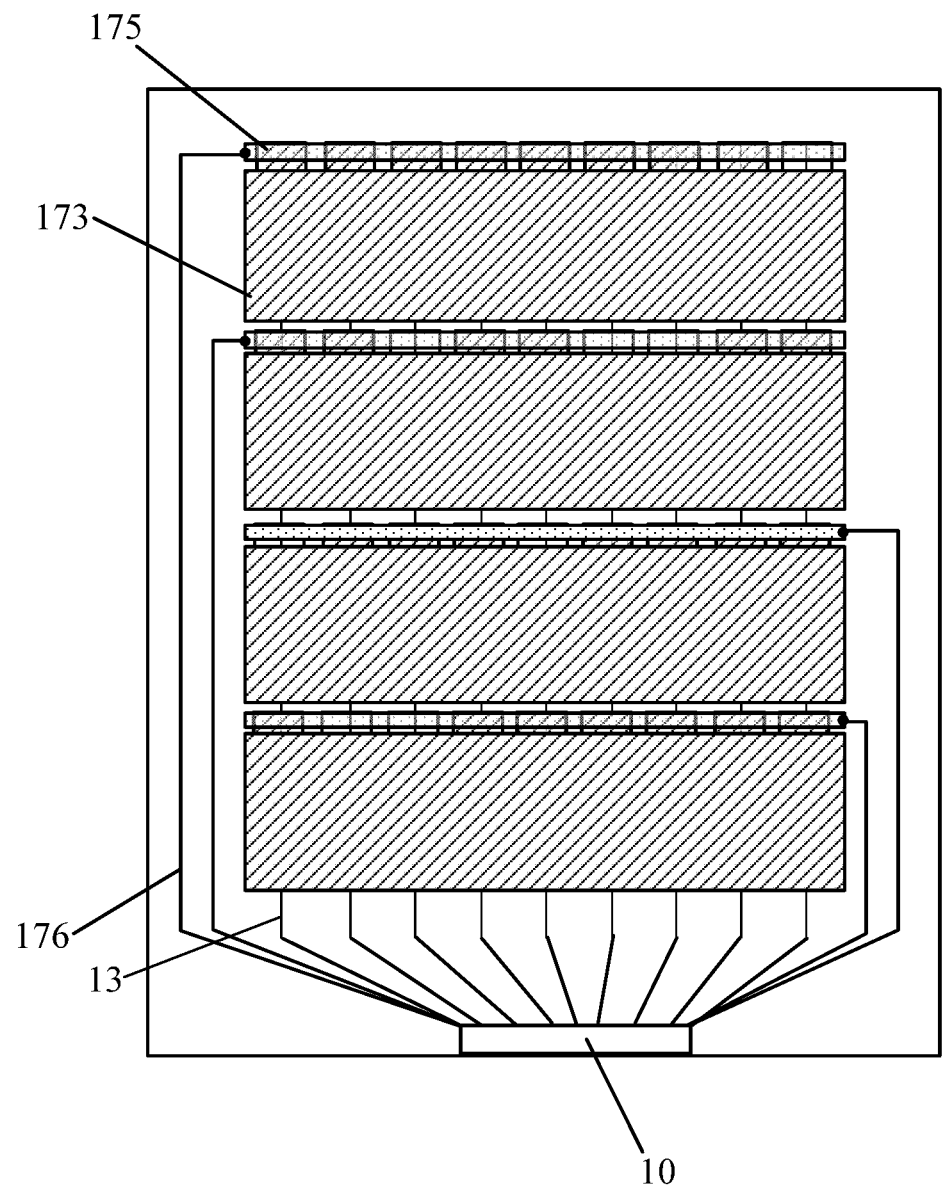
FIG. 16 illustrates a partial schematic diagram of still another organic light-emitting display panel according to an embodiment of the present disclosure.

In order to realize the touch function of the organic light-emitting display panel, the organic light-emitting display panel further includes a plurality of touch electrodes and a plurality of touch signal lines. FIG. 16 illustrates a partial schematic diagram of still another organic light-emitting display panel according to an embodiment of the present disclosure. As shown in FIG. 16, the touch electrode 175 and the cathode layer 173 are located in one layer and are insulated from each other, and the plurality of touch signal line 176 is located in the same metal layer as the first conduction portion 140. After the touch signal line 176 is electrically connected with the first conduction portion 140, their total resistance will further decrease, thereby allowing better uniformity of the display brightness of organic light-emitting display panel.

Figure 17:
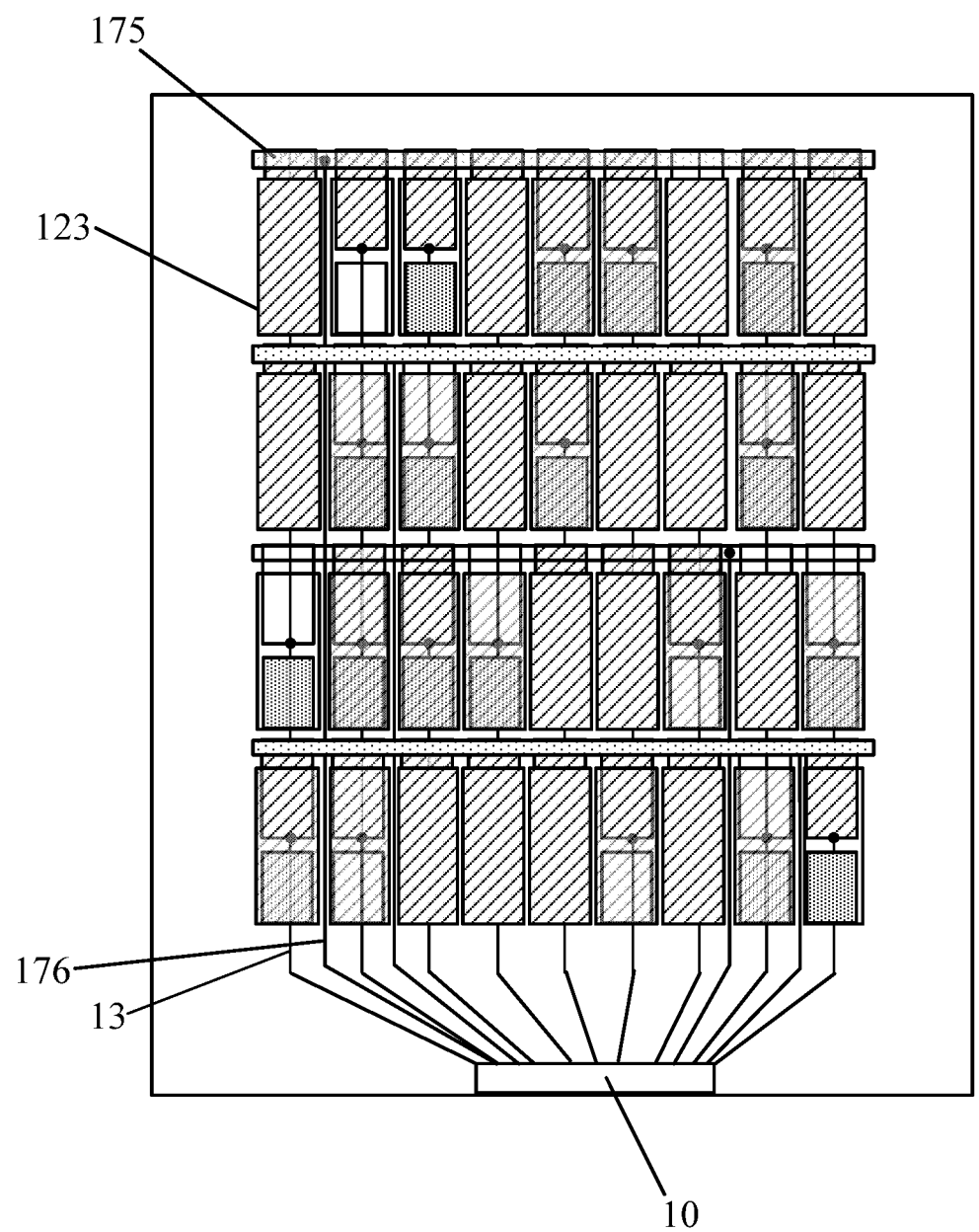
FIG. 17 illustrates a partial schematic diagram of still another organic light-emitting display panel according to an embodiment of the present disclosure.

FIG. 17 illustrates a partial schematic diagram of still another organic light-emitting display panel according to an embodiment of the present disclosure. As shown in FIG. 17, the touch electrode 175 and the pixel electrode 123 are located in one layer and are insulated from each other, and the plurality of touch signal lines 176 and the first conduction portion 140 are located in a same metal layer.

According to an embodiment, the non-display area can include a high level signal line, a low level signal line and a ground potential signal line. At least one of the high level signal line, low level signal line and ground potential signal line is located in the metal layer where the first conduction portion 140 is located. As described above, when one of the high level signal line, low level signal line and ground potential signal line is located in the metal layer where the first conduction portion 140 is located, the resistance of the organic light-emitting display panel will decrease and have better brightness uniformity. Preferably, all of the high level signal line, low level signal line and ground potential signal line are located in the same metal layer where the first conduction portion 140 is located, so as to enhance the effect as described above.

According to an embodiment, the non-display area includes two ground potential signal lines, one of the two ground potential signal lines are located in the same metal layer as the first conduction portion 140. Accordingly, the brightness of the organic light-emitting display panel can be more uniform, and meantime, by configuring that one ground potential line is located in the same metal layer as the first conduction portion 140, the two ground potential signal lines can occupy different spaces, thereby facilitating arrangement of other components. Moreover, as the number of the ground potential line increases, the performance of the organic light-emitting display panel will be improved accordingly.

Figure 18:
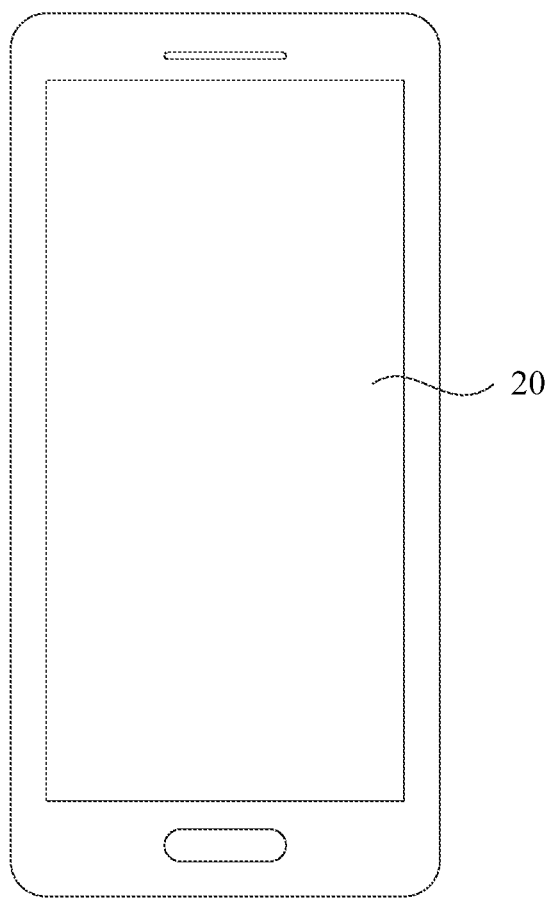
FIG. 18 illustrates a structural schematic diagram of a display terminal according to an embodiment of the present disclosure.

FIG. 18 illustrates a structural schematic diagram of a display terminal according to an embodiment of the present disclosure. As shown in FIG. 18, the display terminal can include the organic light-emitting display panel 120 as described in any above embodiment.

The above are merely preferred embodiments of the present disclosure, without limiting the present disclosure; all modifications, equivalent substitutions and improvements made to the embodiments of the present disclosure within the spirit and principles shall fall into the protection scope of the present disclosure.

What is claimed is:
1. An organic light-emitting display panel, comprising:
a substrate,
a plurality of pixel units placed on the substrate, each of the plurality of pixel units comprising a drain electrode, a pixel electrode, and a light-emitting layer, the drain electrode, the pixel electrode, and the light-emitting layer being placed on the substrate in sequence,
a plurality of power signal conduction lines located on the substrate,
a conduction layer comprising at least one first conduction portion and a plurality of second conduction portions, and
a first insulation layer placed between the conduction layer and the pixel electrodes;
wherein the at least one first conduction portion is insulated from the plurality of second conduction portions, the plurality of second conduction portions is insulated from each other, the at least one first conduction portion is electrically connected with the plurality of power signal conduction lines; and the plurality of second conduction portions is electrically connected with the drain electrodes in one-to-one correspondence; and
wherein an electrode through hole is defined in the first insulation layer, the pixel electrode extends through the electrode through hole to be electrically connected with the second conduction portion.

2. The organic light-emitting display panel according to claim 1, further comprising:
a second insulation layer placed between the drain electrode and the conduction layer,
wherein a plurality of first conduction-layer through holes is defined in the second insulation layer, and each second conduction portion extends through one of the first conduction-layer through holes to connect with the drain electrode; and
the electrode through hole is misaligned with respect to the first conduction-layer through hole.

3. The organic light-emitting display panel according to claim 2, wherein an orthographic projection of a periphery surrounding the electrode through hole on the substrate is located outside an orthographic projection of the light-emitting layer on the substrate.

4. The organic light-emitting display panel according to claim 2, wherein an orthographic projection of a periphery surrounding the first conduction-layer through hole on the substrate is located within an orthographic projection of the light-emitting layer on the substrate, and the first conduction-layer through holes are distributed in an array.

5. The organic light-emitting display panel according to claim 1, wherein the conduction layer is located at a side of the plurality of power signal conduction lines away from the substrate.

6. The organic light-emitting display panel according to claim 1, wherein the first conduction portion covers the power signal conduction line along an extending direction of the power signal conduction line.

7. The organic light-emitting display panel according to claim 2, wherein the plurality of power signal conduction lines and the drain electrodes are arranged in a same layer, a second conduction-layer through hole is defined in the second insulation layer, and the first conduction portion extends through the second conduction-layer through hole to be connected with the power signal conduction line.

8. The organic light-emitting display panel according to claim 1, wherein the at least one first conduction portion is a continuous conductive block, a plurality of hollow portions is defined in the at least one first conduction portion, and the plurality of second conduction portions are placed in the plurality of hollow portions.

9. The organic light-emitting display panel according to claim 1, wherein the conduction layer comprises only one first conduction portion, an orthographic projection of the first conduction portion on the substrate covers orthographic projections of all of the pixel units on the substrate.

10. The organic light-emitting display panel according to claim 1, wherein the conduction layer comprises a single first conduction portion, and the single first conduction portion is a grid-like structure.

11. The organic light-emitting display panel according to claim 1, wherein the substrate comprises a display area and a non-display area, the non-display area comprises an integrated circuit and a power signal line, both the plurality of power signal conduction line and the at least one first conduction portion are connected with the integrated circuit by the power signal line, and the power signal line and the at least one first conduction portion are located in a same metal layer.

12. The organic light-emitting display panel according to claim 11, wherein the power signal line is a metal block electrically connected with all of the plurality of power signal conduction lines.

13. The organic light-emitting display panel according to claim 11, further comprising:
a plurality of data-signal conduction lines, and
a plurality of data signal lines;
wherein all of the plurality of data-signal conduction lines are located in the display area, each of the plurality of data-signal conduction lines is electrically connected with drain electrodes of the plurality of pixel units, the plurality of data-signal conduction lines is electrically connected with the integrated circuit by the plurality of data signal lines located in the non-display area, and the plurality of data signal lines is located in the same metal layer as the at least one first conduction portion.

14. The organic light-emitting display panel according to claim 11, further comprising:
a cathode layer, and
a cathode signal conduction line,
wherein the cathode signal conduction line is electrically connected with both the cathode layer and the integrated circuit, and the cathode signal conduction line is located in the same metal layer as the at least one first conduction portion.

15. The organic light-emitting display panel according to claim 14, further comprising:
a plurality of touch electrodes, and
a plurality of touch signal lines,
wherein the plurality of touch electrodes and the cathode layer are located in a same layer, and are insulated from each other, and
wherein the plurality of touch signal lines is located in the same metal layer as the at least one first conduction portion.

16. The organic light-emitting display panel according to claim 1, further comprising:
a plurality of touch electrodes, and
a plurality of touch signal lines,
wherein the plurality of touch electrodes and the pixel electrode are located in a same layer, and are insulated from each other, and
wherein the plurality of touch signal lines and the at least one first conduction portion are located in a same metal layer.

17. The organic light-emitting display panel according to claim 11, wherein the non-display area further comprises a high level signal line, a low level signal line and a ground potential signal line, wherein at least one of the high level signal line, the low level signal line and the ground potential signal line are located in the same metal layer as the at least one first conduction portion.

18. The organic light-emitting display panel according to claim 13, wherein the conduction layer comprises a plurality of first conduction portions, the plurality of first conduction portions are strip-like, a gap is defined between every two adjacent first conduction portions, a part of the plurality of data-signal conduction lines is located in a same metal layer where the plurality of first conduction portions is located, and is located in the gap.

19. The organic light-emitting display panel according to claim 11, wherein the non-display area comprises two ground potential signal lines, and one of the two ground potential signal lines is located in the same metal layer as the at least one first conduction portion.

20. A display terminal comprising an organic light-emitting display panel, the organic light-emitting display panel comprising:
a substrate,
a plurality of pixel units placed on the substrate, each of the plurality of pixel units comprising a drain electrode, a pixel electrode, and a light-emitting layer, the drain electrode, the pixel electrode, and the light-emitting layer being placed on the substrate in sequence, a plurality of power signal conduction lines located on the substrate, a conduction layer comprising at least one first conduction portion and a plurality of second conduction portions, and a first insulation layer placed between the conduction layer and the pixel electrodes;

wherein the at least one first conduction portion is insulated from the plurality of second conduction portions, the plurality of second conduction portions is insulated from each other, the at least one first conduction portion is electrically connected with the plurality of power signal conduction lines; and the plurality of second conduction portions is electrically connected with the drain electrodes in one-to-one correspondence; and wherein an electrode through hole is defined in the first insulation layer, the pixel electrode extends through the electrode through hole to be electrically connected with the second conduction portion.

* * * * *